United States Patent [19]

Koike

[11] Patent Number: 4,486,673

[45] Date of Patent: Dec. 4, 1984

[54] FLIP-FLOP CIRCUIT

[75] Inventor: Hideharu Koike, Chigasaki, Japan

[73] Assignee: Tokyo Shibaura Denki Kabushiki Kaisha, Kawasaki, Japan

[21] Appl. No.: 356,768

[22] Filed: Mar. 10, 1982

[30] Foreign Application Priority Data

Mar. 27, 1981 [JP] Japan .................................. 56-45051

[51] Int. Cl.$^3$ ............................................ H03K 3/356
[52] U.S. Cl. ..................................... 307/279; 307/288
[58] Field of Search ................... 307/272 A, 279, 288, 307/291, 289; 377/116, 117, 121

[56] References Cited

U.S. PATENT DOCUMENTS

| | | | |
|---|---|---|---|
| 3,267,295 | 8/1966 | Zuk | 307/279 X |
| 3,928,773 | 12/1975 | Oguey et al. | 307/279 |
| 3,980,897 | 9/1976 | Arnold | 307/279 X |
| 4,356,411 | 10/1982 | Suzuki et al. | 307/279 X |

Primary Examiner—Larry N. Anagnos
Attorney, Agent, or Firm—Finnegan, Henderson, Farabow, Garrett & Dunner

[57] ABSTRACT

A flip-flop circuit of set-reset type comprising complementary MOS transistors.

The flip-flop circuit comprises a first CMOS NOR circuit to which set signal is applied, and a second CMOS NOR circuit having same arrangement as the first CMOS NOR circuit and to which reset signal is applied.

Set signal is the logical product signal of first set signal and second set signal. Reset signal is the logical product signal of first reset signal and second reset signal. Neither of first set and reset signals becomes logic "1" simultaneously. Second set and reset signals are kept either unchanged during the time period when first set and reset signals are logic "1" or become logic "1" only during the time period when first set and reset signals are logic "1".

The first NOR circuit comprises first and second transistors of first conductivity type connected in series between first power supply terminal and third transistor, third and fourth transistors of second conductivity type, and a fifth transistor of second conductivity type connected between the node of second and third transistors and the second power supply terminal. First set signal is applied to gates of first and fourth transistors and second set signal to the gate of third transistor. The second transistor is gate-connected to the fifth transistor.

4 Claims, 26 Drawing Figures

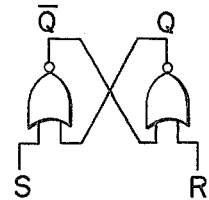
F I G. 1
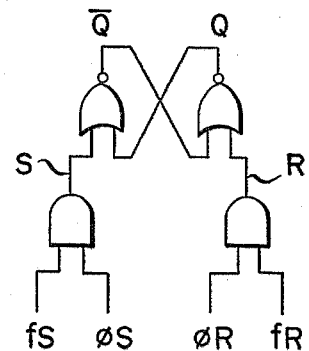
F I G. 2
F I G. 3 (PRIOR ART)
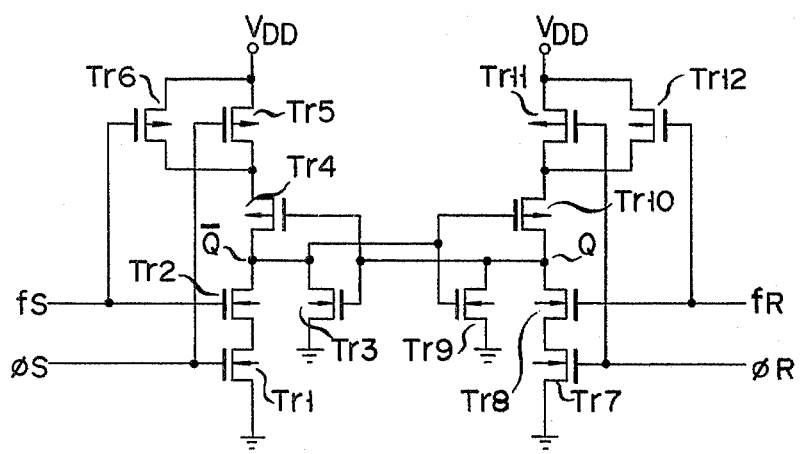

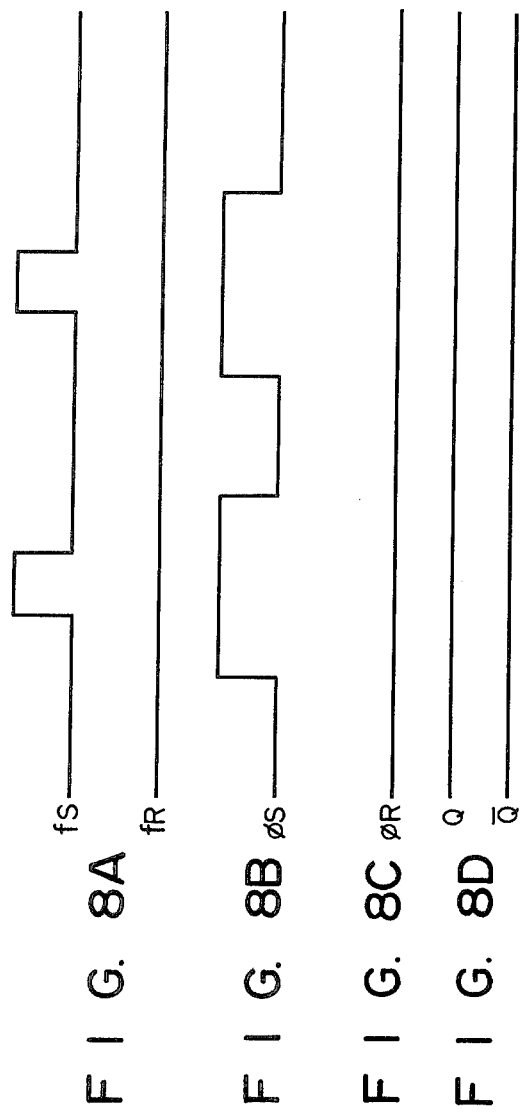

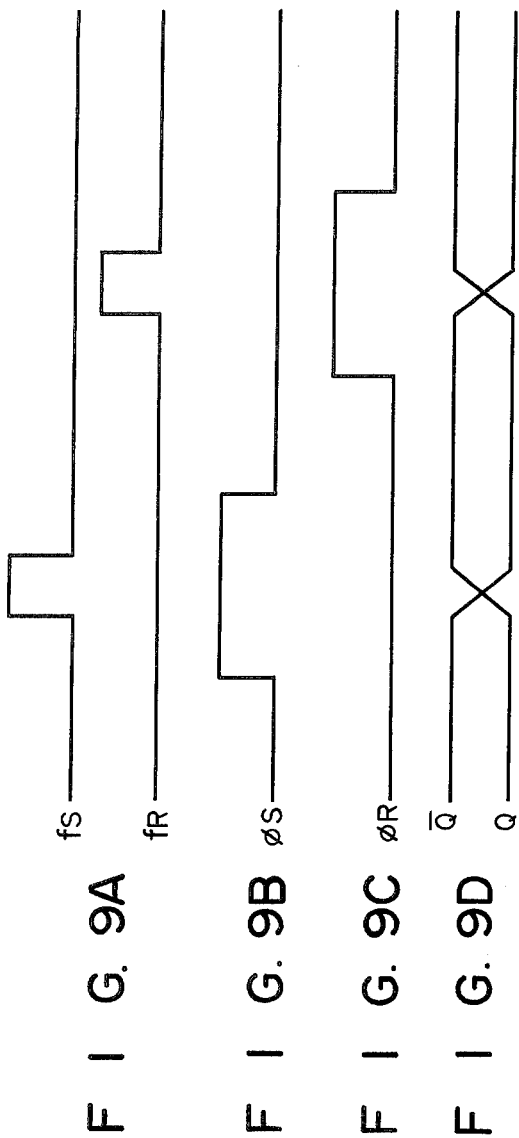

FLIP-FLOP CIRCUIT

BACKGROUND OF THE INVENTION

The present invention relates to a flip-flop circuit comprising complementary MOS transistors.

FIG. 1 is a logical diagram showing a well known flip-flop circuit of set-reset (S-R) type. S represents a set signal, R a reset signal, Q a set output which becomes logic "1" when set, and $\overline{Q}$ a reset output which is an inverted signal of set output Q.

As shown in FIG. 2, it is assumed that set signal S is formed by the logical product $\phi_S \cdot f_S$ of two signals $\phi_S$ and $f_S$, and that reset signal R is formed by the logical product $\phi_R \cdot f_R$ of two signals $\phi_R$ and $f_R$. However, it is also assumed that signals $\phi_S$ and $\phi_R$ do not become logic "1" simultaneously and that signals $f_S$ and $f_R$ do not change during the time when signals $\phi_S$ and $\phi_R$ are logic "1".

When the flip-flop circuit shown in FIG. 2 is formed by a complementary type of MOS (CMOS), it will become a circuit shown in FIG. 3. This circuit comprises a driver circuit consisting of six N-channel MOS transistors Tr1 to Tr3 and Tr7 to Tr9 and a load circuit consisting of six P-channel MOS transistors Tr4 to Tr6 and Tr10 to Tr12. First set signal $\phi_S$ is supplied to gates of transistors Tr1 and Tr5, and second set signal $f_S$ is supplied to gates of transistors Tr2 and Tr6. First reset signal $\phi_R$ is supplied to gates of transistors Tr7 and Tr11 and second reset signal $f_R$ is supplied to gates of transistors Tr8 and Tr12. The flip-flop circuit using this CMOS is of static type.

When the number of inputs is small as shown in FIG. 1, the number of circuit elements may be small even if the flip-flop circuit of static type is formed by a CMOS circuit of static type, and the area occupied by this flip-flop circuit is not so larger than when the flip-flop circuit is formed using a dynamic circuit. However, when the number of inputs becomes large as shown in FIG. 2, the static flip-flop circuit is increased in the number of elements used and occupies an area larger than when it is formed using the dynamic circuit.

When input condition is complicated, conventional static flip-flop circuits had such drawback that their integration was low. In addition, because static circuits had a large input capacitance, their operation speed was slow and their current consumption was large.

SUMMARY OF THE INVENTION

The object of the present invention is to provide a flip-flop circuit capable of enhancing its integration and operation speed and reducing its current consumption.

The object of the present invention can be achieved by a flip-flop circuit formed using a CMOS so as to perform dynamic operation.

The flip-flop circuit according to the present invention comprises: first and second transistors each being of first conductive type and having a conductive path comprised of a source region, a channel forming region and a drain region, and control electrode (gate electrode), and one end of conductive path of first transistor being connected to a first power supply terminal while the other end thereof to one end of conductive path of second transistor; a third transistor of second conductive type arranged between the other end of conductive path of second transistor and a second power supply terminal, the control electrode of third transistor being connected to that of a second transistor; a first circuit arranged between the other end of conductive path of second transistor and the second power supply terminal, the first circuit comprising a first logical circuit and a fourth transistor of second conductive type connected in series with each other, and the first logical circuit including one or more transistor(s) of second conductive type; fifth and sixth transistors each being of first conductive type and having a conductive path and a control electrode, and one end of conductive path of fifth transistor being connected to the first power supply terminal while the other end thereof to one end of conductive path of sixth transistor; a seventh transistor arranged between the other end of conductive path of sixth transistor and the second power supply terminal, the control electrode of seventh transistor being connected that of sixth transistor while to the node between the second transistor and the first circuit; a second circuit arranged between the other end of conductive path of sixth transistor and the second power supply terminal, the second circuit comprising a second logical circuit and an eighth transistor of second conductive type connected in series with each other, the second logical circuit including one or more transistor(s) of second conductive type, and the node between the sixth transistor and the second circuit being connected to the control electrode of second transistor; a means for supplying a first set signal to control electrodes of first and fourth transistors; a means for supplying a first reset signal to control electrodes of fifth and eighth transistors, neither of first set and reset signals becoming logic "1" simultaneously; a means for supplying a second set signal to the first logical circuit, the second set signal being either kept unchanged during the time when the first set signal is logic "1" or becoming logic "1" only during the time when the first set signal is logic "1"; and a means for supplying a second reset signal to the second logical circuit, the second reset signal being either kept unchanged during the time when the first reset signal is logic "1" or becoming logic "1" only during the time when the first reset signal is logic "1".

The flip-flop circuit arranged as described above allows the number of elements used to be decreased and the area occupied to be reduced even if input condition is complicated.

BRIEF DESCRIPTION OF THE DRAWINGS

Other objects and advantages of the present invention will be readily appreciated as the present invention becomes better understood with reference to the following detailed description when considered in connection with the accompanying drawings, in which like reference characters designate same or similar parts throughout figures thereof.

FIG. 1 is a logical diagram showing a typical flip-flop circuit of S-R type;

FIG. 2 is a logical diagram showing a flip-flop circuit of S-R type whose input condition is complicated;

FIG. 3 is a circuit diagram showing a conventional flip-flop circuit in which the circuit shown in FIG. 2 is formed using CMOS transistors;

FIGS. 5A through 5D, 6A through 6D, 7A through 7D, 8A through 8D and 9A through 9D are time charts used to explain the operation of flip-flop circuit shown in FIG. 4;

DETAILED DESCRIPTION OF THE PREFERRED EMBODIMENTS

An embodiment of flip-flop circuit according to the present invention will be described with reference to FIG. 4. This flip-flop circuit forms the logical circuit shown in FIG. 2. First set and reset signals $\phi_S$ and $\phi_R$ do not become logic "1" simultaneously as described above. It is assumed that second set and reset signals $f_S$ and $f_R$ do not change during the time when first set and reset signals $\phi_S$ and $\phi_R$ are logic "1". The flip-flop circuit shown in FIG. 4 comprises a first CMOS circuit 10 and a second CMOS circuit 12. The first CMOS circuit 10 comprises a driver circuit including three N-channel MOS transistors Tr1 to Tr3, and a load circuit including two P-channel MOS transistors Tr4 and Tr5. The second CMOS circuit 12 comprises a driver circuit including three N-channel MOS transistors Tr6 to Tr8, and a load circuit including two P-channel MOS transistors Tr9 and Tr10.

In the case of first CMOS circuit 10, conductive paths (each of which comprises of a source, a channel forming region and a drain) of MOS transistors Tr1, Tr2, Tr4 and Tr5 are connected successively and in series with one another between an earthed end and a power source $V_{DD}$. First set signal $\phi_S$ is supplied to gates of transistors Tr1 and Tr5. Second set signal $f_S$ is supplied to the gate of transistor Tr2.

In the case of second CMOS circuit 12, conductive paths of MOS transistors Tr6, Tr7, Tr9 and Tr10 are connected successively and in series with one another between an earthed end and a power source $V_{DD}$. First reset signal $\phi_R$ is supplied to gates of transistors Tr6 and Tr10. Second reset signal $f_R$ is supplied to the gate of transistor Tr7.

The source of transistor Tr3 in the first CMOS circuit 10 is connected to the earthed end while the drain thereof to the drain of transistor Tr2. The source of transistor Tr8 in the second CMOS circuit 12 is connected to the earthed end while the drain thereof to the drain of transistor Tr7. The node between transistors Tr2 and Tr3, that is, reset output terminal $\overline{Q}$ is connected to gates of transistors Tr8 and Tr9 in the second CMOS circuit 12. The node between transistors Tr7 and Tr8, that is, set output terminal Q is connected to gates of transistors Tr3 and Tr4 in the first CMOS circuit 10.

Figure 4:
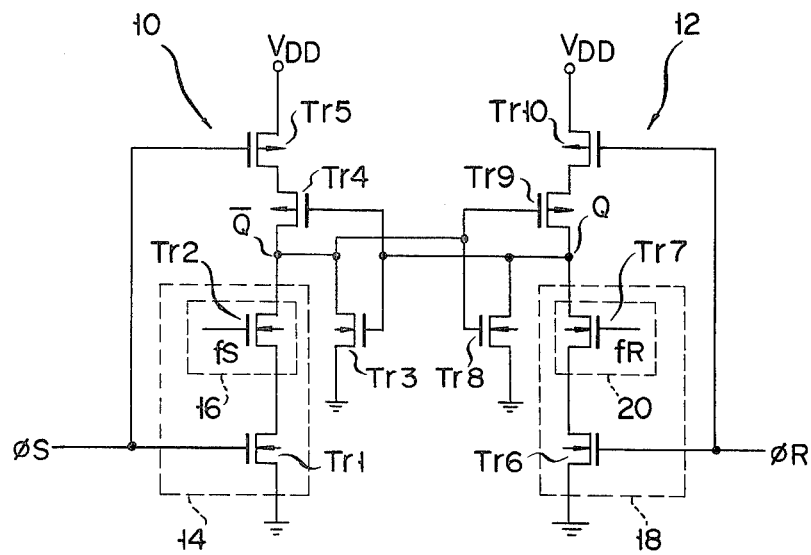
FIG. 4 is a circuit diagram showing a flip-flop circuit formed by CMOS transistors according to the present invention.

It can be understood that the number of elements used in the flip-flop circuit shown in FIG. 4 is smaller by two elements as compared with the conventional flip-flop circuit shown in FIG. 3.

The operation of flip-flop circuit according to the present invention will be now described referring to FIG. 4 and time charts shown in FIGS. 5A to 5D, 6A to 6D and 7A to 7D.

Figure 5A:
Figure 5B:
Figure 5C:
Figure 5D:

As shown in FIG. 5D, the transistor Tr3 is ON in the case where the set output terminal Q is logic "1" (Q="1"). As shown in FIG. 5B, therefore, the reset output terminal $\overline{Q}$ is kept "0" and unchanged independently of value of second set signal $f_S$ even if first set signal $\phi_S$ changes from "0" level to "1" level.

Figure 6A:
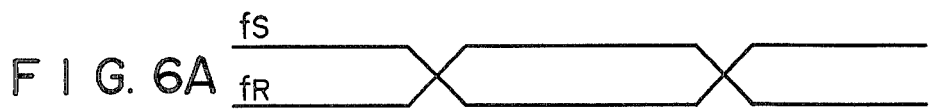
Figure 6B:
Figure 6C:
Figure 6D:

It is assumed that first set signal $\phi_S$ changes from "0" to "1" as shown in FIG. 6B in the case where the set output terminal Q is logic "0" (Q="0") as shown in FIG. 6D and second set signal $f_S$ is "1" level as shown in FIG. 6A. Transistors Tr1 and Tr2 are turned ON and the reset output terminal $\overline{Q}$ therefore changes from logic "1" to "0" in this case. Since transistors Tr9 and Tr10 are thus made conductive, the set output terminal Q changes from logic "0" to "1" to thereby complete the set operation of flip-flop circuit.

It is assumed that first reset signal $\phi_R$ changes from "0" level to "1" level as shown in FIG. 6C in the case where the reset output terminal $\overline{Q}$ is logic "0" ($\overline{Q}$="0") as shown in FIG. 6D and second reset signal $f_R$ is "1" level as shown in FIG. 6A. Since transistors Tr6 and Tr7 are turned ON in this case, the set output terminal Q changes from logic "1" to "0". Transistors Tr4 and Tr5 are thus rendered conductive and the reset output terminal $\overline{Q}$ changes from logic "0" to "1" to thereby complete the reset operation of flip-flop circuit.

Figure 7A:
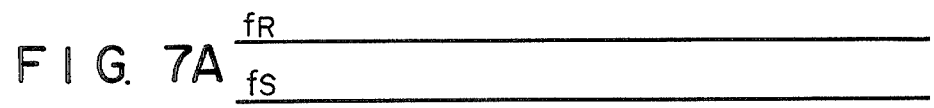
Figure 7B:
Figure 7C:
Figure 7D:
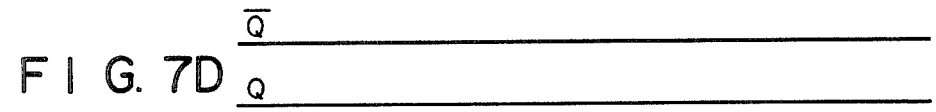

It is assumed that second set signal $f_S$ is "0" level in the case where the set output terminal Q is logic "0" as shown in FIG. 7D. When first set signal $\phi_S$ is kept logic "1" this time for a predetermined time period as shown in FIG. 7B, transistors Tr2, Tr3 and Tr5 are turned OFF. Therefore, the reset output terminal $\overline{Q}$ keeps "1" level dynamically. It is necessary that the time period during which first set signal $\phi_S$ is kept logic "1" is shorter enough than the time period during which charge at the reset output terminal $\overline{Q}$ is discharged due to leakage.

The remaining operation in the case of reset is same as that in the case of above-described set and description on the remaining operation will be omitted accordingly.

If both of second set and reset signals $f_S$ and $f_R$ shown in FIG. 4 are logic "1" ($f_S = f_R =$ "1"), both of transistors Tr2 and Tr7 will be ON. Since these transistors can be therefore neglected, the circuit shown in FIG. 4 becomes equivalent to the logical circuit shown in FIG. 1. When first set signal $\phi_S$ changes from logic "0" to "1" in the case where second set signal $f_S$ is logic "0" ($f_S =$ "0") and reset output terminal $\overline{Q}$ is logic "1", the reset output terminal $\overline{Q}$ holds its charge dynamically. This is because transistors Tr2 and Tr5 are turned OFF. Further, when first reset signal $\phi_R$ changes from logic "0" to "1" in the case where second reset signal $f_R$ is logic "0" ($f_R =$ "0") and set output terminal Q is logic "1", the set output terminal Q holds its charge dynamically. This is because transistors Tr7 and Tr10 are turned OFF.

The flip-flop circuit shown in FIG. 4 operates even in the case where second set and reset signals $f_S$ and $f_R$ change to logic "1" only during the time period when first set and reset signal $\phi_S$ and $\phi_R$ are logic "1".

When the set output terminal Q is logic "1" (Q="1") as shown in FIG. 8D, the transistor Tr3 is ON. Since the reset output terminal $\overline{Q}$ is therefore logic "0" independently of change of second set signal $f_S$, the condition of flip-flop circuit is kept unchanged.

Even if first set signal $\phi_S$ changes from logic "0" to "1" as shown in FIG. 9B in the case where the set output terminal Q is logic "0" as shown in FIG. 9D, second set signal $f_S$ is kept logic "0" for a predetermined time period as shown in FIG. 9A and the reset output terminal $\overline{Q}$ therefore holds its charge dynamically. When second set signal $f_S$ changes from logic "0" to "1" as shown in FIG. 9A, charge at the reset output terminal $\overline{Q}$ is discharged to the earth through transistors Tr1 and Tr2. Since transistors Tr9 and Tr10 are therefore made conductive, the set output terminal Q changes from logic "0" to "1" and the set operation of flip-flop circuit is finished.

Even if first reset signal $\phi_R$ changes from logic "0" to "1" as shown in FIG. 9C in the case where the reset output terminal $\overline{Q}$ is logic "0" as shown in FIG. 9D, second reset signal $f_R$ is kept logic "0" for a predetermined time period as shown in FIG. 9A and the set output terminal Q therefore holds its charge dynamically. When second reset signal $f_R$ changes from logic "0" to "1" as shown in FIG. 9A, charge at the set output terminal Q is discharged to the earth through transistors Tr6 and Tr7. Since transistors Tr4 and Tr5 are thus rendered conductive, the reset output terminal $\overline{Q}$ changes from logic "0" to "1" and the reset operation of flip-flop circuit is finished.

Referring to FIG. 4, let us consider a first circuit 14 comprising the transistor Tr1 to which first set signal $\phi_S$ is applied, and a first logical circuit 16 formed by the transistor Tr2. Transistors Tr1 and Tr2 may be arranged reverse to those in FIG. 4. However, it is preferable that the transistor Tr1 is connected to the earthed end. Namely, when first set signal $\phi_S$ changes from logic "0" to "1" with second set signal $f_S$ held "0" in the case where the transistor Tr1 and first logical circuit 16 are reversely arranged, charge stored at the reset output terminal $\overline{Q}$ is reduced. Same thing can be said to a second circuit 18 comprising the transistor Tr6 to which first reset signal $\phi_R$ is applied, and a second logical circuit 20 formed by the transistor Tr7. Namely, when first reset signal $\phi_R$ changes from logic "0" to "1" with second reset signal $f_R$ held "0" in the case where the transistor Tr6 and second logical circuit 20 are reversely arranged, charge stored at the set output terminal Q is also reduced.

Figure 10:
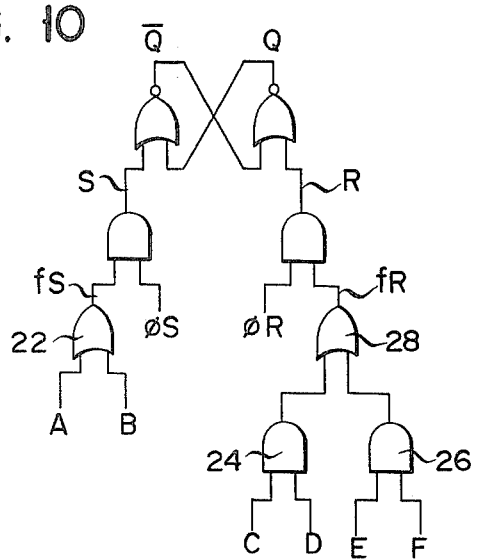
FIG. 10 is a logical circuit diagram showing another flip-flop circuit of R-S type according to the present invention.
Figure 11:
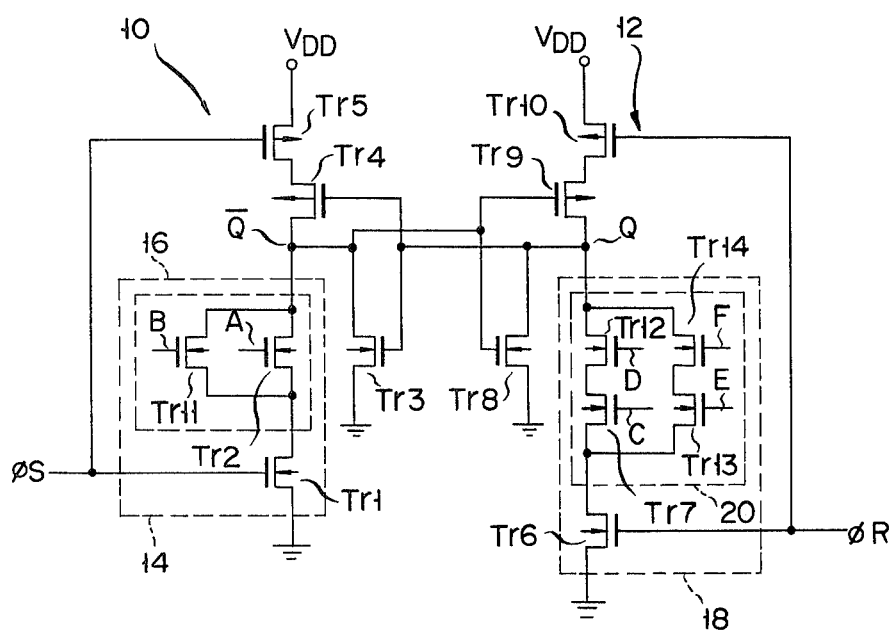
FIG. 11 is a circuit diagram showing the circuit embodied from the logical diagram shown in FIG. 10.

Another embodiment of flip-flop circuit according to the present invention will be now described referring to FIGS. 10 and 11. Second set and reset signals $f_S$ and $f_R$ in this flip-flop circuit are formed by plural input condition signals. Second set signal $f_S$ is the output of an OR circuit 22 to which signals A and B are applied. Second reset signal $f_R$ is the output of an OR circuit 28 to which the output of an AND circuit 24 for receiving signals C and D and the output of an AND circuit 26 for receiving signals E and F are applied. Even if second set and reset signals $f_S$ and $f_R$ are composed on such a complicated logic, it is assumed that second set and reset signals $f_S$, $f_R$ and first set and reset signals $\phi_S$, $\phi_R$ meet their relations as described above, that is, they take such timings as shown in FIGS. 5A to 9D. The logical circuit is formed only by the driver transistor in this case and load transistors are controlled by first set and reset signals $\phi_S$ and $\phi_R$.

FIG. 11 shows the flip-flop circuit embodied from the logical diagram shown in FIG. 10. As shown in FIG. 11, a transistor Tr11 is OR-connected to the transistor Tr2 and a transistor Tr12 is AND-connected to the transistor Tr7. AND-connected transistors Tr13 and Tr14 are OR-connected to AND-connected transistors Tr7 and Tr12. Signal A is supplied to the gate of transistor TR2, signal B to the gate of transistor Tr11, signal C to the gate of transistor Tr7, signal D to the gate of transistor Tr12, signal E to the gate of transistor Tr13 and signal F to the gate of transistor Tr14. Since other elements are same as those in the circuit shown in FIG. 4, these same elements are represented by same reference characters and description on these elements will be omitted.

According to the flip-flop circuit shown in FIG. 11, the number of transistor elements can be reduced to a greater extent as compared with conventional flip-flop circuits even if input condition is complicated. The area occupied by the flip-flop circuit can also be reduced accordingly. In addition, operation speed can be enhanced and current comsumption can be reduced thanks to the reduction of parasitic capacitance.

Obviously, various modifications and variations of the present invention can be made in the light of above teachings. It is therefore to be understood that, within the scope of appended claims, the present invention may be practiced otherwise than as specifically described.

What is claimed is:

1. A flip-flop circuit comprising:

first and second transistors each being of first conductivity type and having a conductive path and a control electrode, and one end of the conductive path of said first transistor being connected to a first power supply terminal while the other end thereof to one end of the conductive path of said second transistor;

a third transistor of second conductivity type arranged between the other end of the conductive path of said second transistor and a second power supply terminal, the control electrode of said third transistor being connected to that of said second transistor;

a first circuit arranged between the other end of the conductive path of said second transistor and the second power supply terminal and comprising a first logical circuit and a fourth transistor of second conductivity type connected in series with each other, said first logical circuit including one or more transistor(s) of second conductivity type;

fifth and sixth transistors each being of first conductivity type and having a conductive path and a control electrode, and one end of the conductive path of said fifth transistor being connected to the first power supply terminal while the other end thereof to one end of the conductive path of said sixth transistor;

a seventh transistor of second conductivity type arranged between the other end of the conductive path of said sixth transistor and the second power supply terminal, the control electrode of said seventh transistor being connected to that of said sixth transistor while to the node between the second transistor and the first circuit;

a second circuit arranged between the other end of the conductive path of said sixth transistor and the second power supply terminal and comprising a second logical circuit and an eighth transistor of second conductivity type connected in series with each other, said second logical circuit including one or more transistor(s) of second conductivity type, and the node between the sixth transistor and the second circuit being connected to the control electrode of said second transistor;

a means for supplying a first set signal to control electrodes of said first and fourth transistors;

a means for supplying a first reset signal to control electrodes of said fifth and eighth transistors, neither of said first set and reset signals becoming logic "1" simultaneously;

a means for supplying a second set signal to the first logical circuit, said second set signal either being kept unchanged during the time period when said first set signal is logic "1" or becoming logic "1" only during the time period when said first set signal is logic "1"; and a means for supplying a second reset signal to the second logical circuit, said second reset signal either being kept unchanged during the time period when said first reset signal is logic "1" or becoming logic "1" only during the time period when said first reset signal is logic "1".

2. A flip-flop circuit according to claim 1, wherein each one end of the conductive path of said fourth and eighth transistors is connected to the second power supply terminal.

3. A flip-flop circuit according to claim 1 or 2, wherein said second set and reset signals are logically composed of plural signals.

4. A flip-flop circuit according to claim 1, wherein said first, second, fifth and sixth transistors are of P-type MOS transistors and said third, fourth, seventh and eighth transistors are of N-type MOS transistors.

* * * * *